Figure 1:
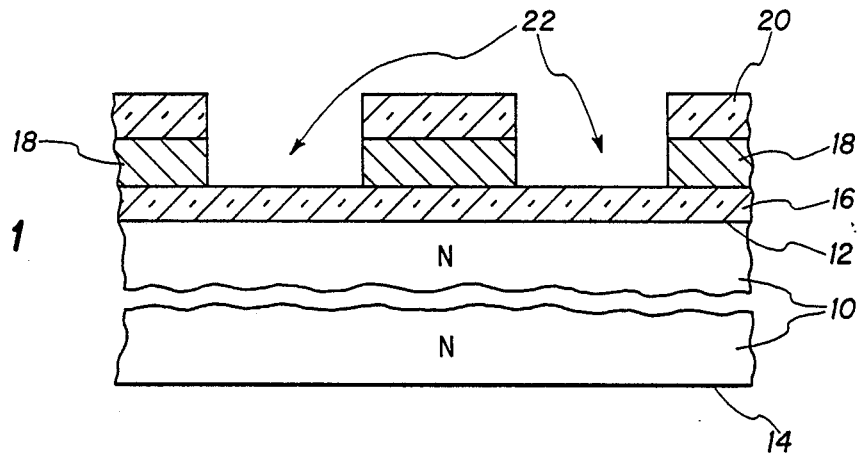

United States Patent [19]

Cawlfield

[11] Patent Number: 4,898,835
[45] Date of Patent: Feb. 6, 1990

[54] SINGLE MASK TOTALLY SELF-ALIGNED POWER MOSFET CELL FABRICATION PROCESS

[75] Inventor: Billy G. Cawlfield, Dallas, Tex.

[73] Assignee: SGS-Thomson Microelectronics, Inc., Carrollton, Tex.

[21] Appl. No.: 256,505

[22] Filed: Oct. 12, 1988

[51] Int. Cl.$^4$ .............................................. H01L 21/40
[52] U.S. Cl. ................................................ 437/29; 437/6; 437/40; 437/41; 437/197; 437/202
[58] Field of Search ........................ 437/29, 40, 41, 45, 437/50, 58, 202, 196, 197, 188; 357/23.4; 148/126

[56] References Cited

U.S. PATENT DOCUMENTS

| | | | |
|---|---|---|---|
| 3,781,977 | 1/1974 | Hulmes | 437/170 |
| 4,038,107 | 7/1977 | Marr et al. | 437/41 |
| 4,145,700 | 3/1979 | Jambotkar | |
| 4,364,073 | 12/1982 | Becke et al. | |
| 4,419,142 | 12/1983 | Matsukawa | |
| 4,488,348 | 12/1984 | Jolly | |
| 4,494,304 | 1/1985 | Yosbioka | |
| 4,532,534 | 7/1985 | Ford et al. | 357/23.4 |
| 4,566,175 | 1/1986 | Smayling et al. | |
| 4,587,713 | 5/1986 | Goodman et al. | |
| 4,597,824 | 7/1986 | Shinada et al. | 357/23.4 |
| 4,598,461 | 7/1986 | Love | 437/202 |
| 4,610,078 | 9/1986 | Matsukawa et al. | |
| 4,636,822 | 1/1987 | Codella et al. | 437/41 |

FOREIGN PATENT DOCUMENTS

| | | | |
|---|---|---|---|
| 0074674 | 4/1984 | Japan | 437/29 |
| 0156882 | 7/1986 | Japan | 357/23.4 |
| 0159767 | 7/1986 | Japan | 357/23.4 |
| 0162361 | 7/1987 | Japan | 357/23.4 |
| 0229977 | 10/1987 | Japan | 437/41 |

Primary Examiner—Brian E. Hearn
Assistant Examiner—T. Thomas
Attorney, Agent, or Firm—Roland Plottel

[57] ABSTRACT

A process of forming a power MOSFET that needs only a single masking step. A layer of gate oxide and a layer of polysilicon are formed in turn over one surface of a silicon wafer and the polysilicon layer is partially oxidized to form a covering polyoxide layer. The polyoxide and polysilicon layers are apertured to define the source regions of the cells of the transistor. Donor and acceptor ions are introduced by way of the openings into the wafer to form localized source regions each enclosed by a separate region of the opposite conductivity type, surface portions of which underlie the polysilicon layer and serve as the channels of individual cells of the transistor. Dielectric tabs are provided along the sidewalls of the openings which are then filled by an overlying conductive layer that serves as the source electrode of the transistor for each of the cells. The polysilicon layer serves as a common gate electrode for each of the cells. Another conductive layer is provided on the back surface of the wafer to serve as a common drain electrode for all the cells of the transistor.

5 Claims, 2 Drawing Sheets

SINGLE MASK TOTALLY SELF-ALIGNED POWER MOSFET CELL FABRICATION PROCESS

FIELD OF INVENTION

This invention relates to the manufacture of a power metal-oxide-semiconductor field effect transistor (MOSFET), and more particularly to such a transistor of the multi-cell type.

BACKGROUND OF THE INVENTION

A power MOSFET typically includes a plurality of cells or sections that are operated in parallel, each of which includes a source portion on one planar surface and a drain portion on the opposite planar surface of a semiconductor wafer, and the current in each cell flows largely vertically between the two planar surfaces. Typically the source portions are individual localized regions of one conductivity type, N-type in N-type transistors, sharing a common source electrode overlying the one surface and contacting the wafer at the source portions. Typically the drain portions merge and form the bulk of the wafer and share a common drain electrode that extends over and contacts the opposite surface of the wafer. Surrounding each localized source portion is a separate ring-like region of the opposite conductivity, P-type in an N-type transistor. Intermediate between the overlying source electrode and the wafer there is positioned a common gate electrode, typically grid-like in structure for passage of portions of the source electrode through the interstices to make connection to the localized source portions. The gate electrode is insulated from the one surface of the wafer by a thin thermally grown surface oxide that serves as the gate insulator and overlies the surface portion of the separate regions of the opposite conductivity type that serves as the individual channels of the cells of the array.

In this device it is important to provide adequate clearance between cells for proper operation while maintaining close packing for high power capacity. In the prior art, the manufacture of the desired device has involved a number of masking operations for defining the desired structure of the different conductivity-type regions at the one surface and the proper location of the associated source and gate electrodes portions. As a consequence, inside each cell lateral area is consumed by a series of concentric mask lines. Moreover some of the space is used for mask alignment tolerances because of the difficulty of aligning exactly successive mask operations.

SUMMARY OF THE INVENTION

The present invention seeks to minimize the waste of lateral area for mask alignment tolerances by using essentially only a single masking operation for the construction of a basic unit cell so that self-aligning of the various regions can be realized by virtue of the common mask for the various processing steps.

A typical embodiment of the invention involves forming over one surface of a silicon wafer—whose bulk is of one conductivity type, N-type in an illustrative embodiment—in turn a gate oxide layer and a polysilicon layer. The polysilicon layer is then partially oxidized to form over its outer surface an oxide to be termed a polyoxide. The polyoxide and the polysilicon layers are then selectively apertured to form localized openings that will define the source portions of the individual cells. This is done conventionally using photolithographic techniques involving a mask. This is the only mask used in the basic process of forming the desired conductivity-type structure of the wafer. The openings are then used in a double diffusion process to form a shallow N-type surface region useful as the source that is enclosed in a halo-like P-type region, whose surface portions will form the channel of each cell. These diffusions typically are done in an oxidizing ambient resulting in the oxidation of the sidewalls of the openings in the polysilicon layer. Next a relatively thick conformal layer of silicon oxide is deposited over this surface of the wafer for filling the regions. This surface is then etched in an anisotropic etch to reopen the oxide filled regions. Because of the anisotropic nature of the etch, tabs of the deposited oxide are left along the sidewalls of the reformed openings, if the etching is terminated when the central portions of the openings are clear. A metal layer is then deposited over this surface to fill the openings and to serve as the source electrode by contacting the localized N-type diffused surface regions that serve as the source portions of the transistor. Moreover, the polysilicon layer first deposited serves as the common gate electrode and overlies the surface portions of the annular P-type halo regions earlier formed that serve as the channel of each cell. The drain electrode is provided on the opposite broad surface of the wafer and makes electrical contact with the N-type bulk of the wafer.

As mentioned above, the formation of the openings that define the source portions is the only step requiring a masking step. Thereafter, the various other elements of the transistor are self-aligned with such openings without the need for a separate masking step. By such self-alignment, close alignment is easily achieved with a consequent reduction in the need to provide tolerances for misalignment.

The invention will be better understood from the following more detailed description of an illustrative embodiment taken with the accompanying drawing.

BRIEF DESCRIPTION OF THE INVENTION

Each of FIGS. 1-5 shows a portion of a silicon wafer at a different stage of processing in accordance with the invention.

BRIEF DESCRIPTION

With reference now to the drawing, FIG. 1 shows a portion of a silicon wafer 10 in which there are to be formed two cells of a multi-cell power MOSFET. Typically the power MOSFET will include many tens of such cells arranged in a two-dimensional array of which only two are shown here for the sake of simplicity.

Moreover, typically many power transistors will be formed in a single wafer in a common series of steps and the wafer will later be cut up into dice, each of which contains one or more power transistors.

The silicon wafer 10 comprises a pair of major parallel surfaces 12, 14 on one of which 12 will be formed the various channel regions of the transistor and this surface will be called the active surface. In the specific embodiment being described for processing an N-channel MOSFET, the wafer is N-type monocrystalline silicon.

In many instances, the wafer will comprise a bulk portion of relatively low resistivity material and a thinner active surface portion of relatively higher resistivity material in which will be formed the source and channel portions of each transistor.

The wafer has initially been heated in an oxidizing atmosphere to grow non-selectively a thin layer 16 of silicon oxide on surface 12 for serving as the gate dielectric of the transistor. Allowance of the original thickness grown is typically made for any additional growth that will occur inherently in subsequent processing. Moreover, over the silicon oxide layer 16 there has thereafter been deposited, typically by a low pressure chemical vapor deposition (LPCVD) process, a layer of polycrystalline silicon, or polysilicon. Thereafter, the wafer is again heated in an oxidizing ambient to convert an upper portion, typically between one quarter and a half, of the polysilicon layer to an oxide, to be termed a polyoxide. The unconverted portion forms the polysilicon layer 18 and the converted portion forms the polyoxide layer 20. The polysilicon layer 18 will ultimately serve as the common gate electrode of the transistor and, accordingly, should be doped to be highly conductive, usually as deposited.

Layers 18 and 20 are then treated to form openings 22 passing through to gate oxide layer 12. Alternatively the openings can also extend partially or completely through such oxide layer 12. Typically these openings are roughly square and arranged in a two-dimensional array for close packing and the remainder of the polysilicon layer forms a continuous grid-like layer that can serve as the common gate electrode for a transistor. The openings are generally formed in conventional fashion first using photolithographic techniques to pattern a photoresist appropriately by use of a mask and then employing a dry plasma etching process, typically reactive ion etching (RIE) to achieve nearly vertical side walls in the openings.

The masking operation used to form the openings 22 as part of the photolithographic process is the only masking operation needed to form the basic structure. In subsequent processing of the wafer, the apertured double layer will essentially serve as the mask to provide localized selectivity to the remaining steps of processing the wafer and the remaining elements of each transistor to be formed are essentially self-aligned by means of such double layer.

Figure 2:
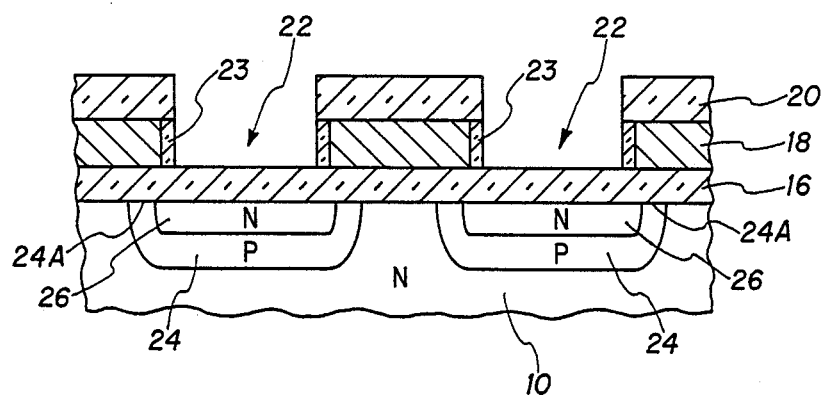

In particular, the wafer is next treated in conventional fashion to form in each opening an N-type surface zone 24 enclosed by a halo-shaped P-type zone 26 in the fashion characteristic of a double-diffused transistor, as seen in FIG. 2. Various techniques are known for forming such double zones. For example, one can first form the zone 26 by implanting acceptor ions through the openings 22 and diffusing such ions partially, and then form halo zone 24 similarly by implanting donor ions also through the openings 22 and then diffuse these to form the enclosed zone 26. The dosage of the donors is sufficient to overcompensate the previously implanted acceptions in the surface portion to form the N-type zones 26 that will serve as the sources of the individual cells of the transistor.

Alternatively, both types of ions can be implanted in turn in any order, care being taken to chose an acceptor that diffuses faster than the donor chosen s that the wider spread of the acceptor results from its higher diffusion rate. Again the dosages are chosen to insure an N-type surface zone 26 enclosed within a halo zone 24. Various combinations of donors and acceptors can be chosen to achieve the desired results. Moreover, the diffusion step needed to spread and activate the implanted ions may be postponed to a later stage of the processing if desired. Typical diffusion steps, since they involve heating in an oxidizing ambient, will tend to oxidize the exposed edges of the polysilicon layer 18 in the openings to form oxide layers 23, as shown.

Because of the lateral spreading during the diffusion, the edges of the N-type zone 26 will typically extend past the oxide edges 23 of the polysilicon layer 18 so that the surface portions 24A of the layer 24 underlie the polysilicon layer 18. Since these surface portions 24A of layer 24 will serve as the channel of the transistor and in operation are to be inverted by the voltage applied to the gate electrode, it is important that such surface portions essentially underlie the polysilicon layer 18 that is to serve as the gate electrode. This can be insured by appropriate control of the formation of zones 24 and 26.

Moreover since zone 26 is to serve as the source of electrode of an individual cell, it is necessary to provide an electrode connection to such zone.

While as previously discussed, there will tend to be formed during normal diffusion processing, an oxide layer 23 at the exposed edge of the polysilicon layer 18 in each opening, this layer 23 is usually not rugged enough to serve as a satisfactory insulator to isolate electrically the polysilicon layer 18 that serves as the gate electrode from such source electrode. This is particularly the case if the diffusion to form layers 24 and 26 is postponed to better insure that surface portions 24A of zone 24 completely underlie polysilicon layer 18. This usually is not adequate insulation to isolate the polysilicon layer 18 from a conductive layer to be formed over the polyoxide layer 20 to serve as a common source electrode connection to the individual source zones 24.

Figure 3:
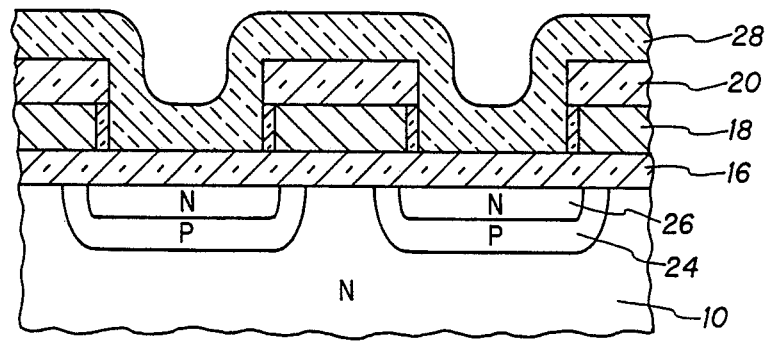

To provide additional insulation, dielectric spacers are preferably provided along the sidewalls of the openings. To this end, there is first deposited a conformed layer 28 of the silicon oxide over the wafer, as seen in FIG. 3. Typically, this oxide is deposited by a known LPCVD process.

Figure 4:
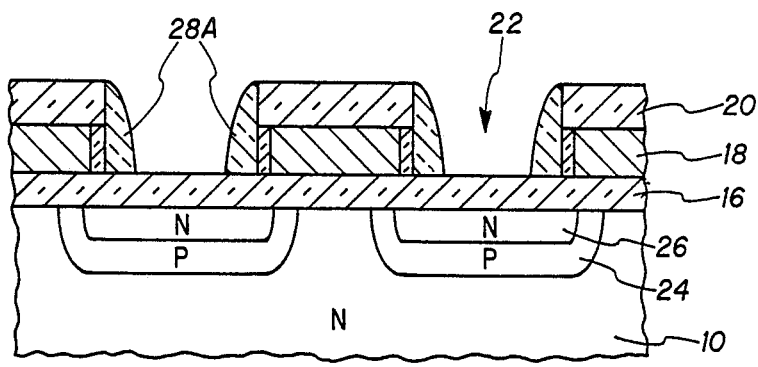

After its deposit, layer 28 is subjected non-selectively to an anisotropic etch, typically reactive ion etching, that is carried out sufficiently to eliminate the deposited silicon oxide from the bottom of each opening 12 while leaving a tab or spacer portion 28A along the sidewalls of the openings, as seen in FIG. 4.

Figure 5:
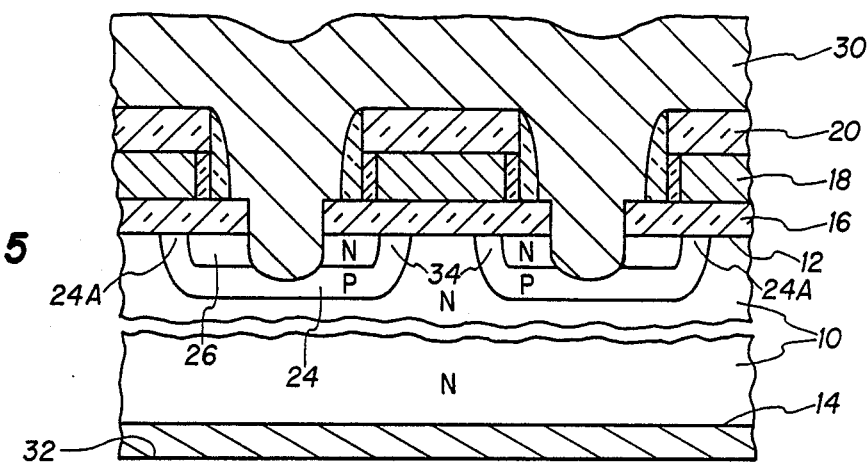

To form the common source electrode, a layer 30 of a metal, typically aluminum, is deposited non-selectively over the active surface of the wafer as shown in FIG. 5. After deposition, the wafer is heated so that in the opening, the aluminum alloys through the thin oxide layer 16 at the bottom of the opening and advantageously even through the N-type surface layer 26. As a result, the layer 30 forms a low resistance connection to both zones 24 and 26, which is generally advantageous. However, it is important that it not alloy completely through the P-type 24 since this would produce a source-drain short circuit.

A metal layer 32, also typically aluminum, is provided over the back surface 14 of the wafer to serve as a common drain electrode for the various cells of the transistor.

Accordingly, the transistor will utilize metal layer 30 as the source electrode, metal layer 32 as the drain electrode, and polysilicon layer 18 as the gate electrode. To this end, a portion of the polysilicon layer 18, typically at the periphery of an individual transistor needs to be exposed and provided with an electrode connection by means of which the gate voltage is applied during operation. Each cell of the transistor will include the N-type surface layer as the source, N-type bulk 10 as the drain, and the channel will be formed by inversion, of a surface portion 24A, underlying the gate electrode, of the P-type layer 24.

For operation, the surface portions 24 are inverted by the application of a suitable gate voltage to the gate electrode and then electrons will flow from the front or active surface 12 out of each N-type source region 26 laterally through the formed channel in region 24A to the N-type bulk drain 10 and then vertically to the drain electrode 32.

In a typical design, gate oxide layer 16 would be about 700 to 1500 angstroms thick, polysilicon layer 18 is about 3,000 to 10,000 angstroms thick, polyoxide layer 20 about 1,000 to 5,000 angstroms thick, and the deposited conformal layer 28 about 1 to 2 microns thick, openings 22 about 1 by 4 microns, and the sidewall spacers 28A about 5,000 to 10,000 angstroms wide.

Various modifications can be made in the specific process described without departing from the spirit of the invention. For example, the implantation to form the N-type zone 26 can be postponed until after formation of the tabs 28A if desired to shorten the lateral width of the source zone and thereby to insure that it does not extend appreciably under the polysilicon gate electrode and thereby increase excessively the source/gate capacitance.

There can also be varied the shape of the openings 22 from square to circular, for example. There may be changes in the materials used, particularly for formation of the tabs 28A. For example, deposited silicon nitride can be used for the deposited silicon oxide. Also, various other metals can be used for the source and drain electrodes.

Additionally, the invention can be employed to form P-channel transistors by reversing the conductivity type of the various regions involved in the fashion familiar to workers in the art.

What is claimed:

1. A process for making a multicell power MOSFET comprising the steps of
preparing a monocrystalline silicon wafer whose bulk is of one conductivity type,
forming in turn over one surface of the wafer a thermally-grown oxide layer and a polysilicon layer,
oxidizing the top surface portion of the polysilicon layer to form of it a polyoxide layer,
forming openings at least through the polyoxide and polysilicon layers for defining localized portions of the wafer,
introducing donor and acceptor ions into the silicon wafer by way of said openings for forming an enclosed surface zone of the one conductivity type, adjacent each of said openings and a separate zone of the opposite conductivity enclosing each of said surface zones, each of the enclosing zones including a surface region essentially all of which underlies the polysilicon layer so that, when inverted, it can serve as a conductive channel between the enclosed surface zone of the one conductivity type and the bulk of the wafer of the one conductivity type,
forming an insulating layer over the edges of the polysilicon layer exposed in each opening,
depositing a conductive layer over the polyoxide layer and in the openings for penetrating the thermally-grown oxide layer in the openings and making low resistance electrical connection at least to each of the surface regions of the one conductivity type,
and providing a separate low resistance electrical connection to the bulk of the wafer.

2. The process of claim 1 in which the step of forming the insulating layer over the edges of the polysilicon layer exposed in each opening comprises depositing a conforming insulating layer over the polyoxide layer for filling the openings, and etching said insulating layer anisotropically to reform openings in the filled previous openings, while leaving tab portions of the insulating layer along the sidewalls of the reformed openings.

3. The process of claim 1 in which the bulk of the wafer and the enclosed surface zone of the one-type are of N-type and the enclosing zone is of P-type.

4. The process of claim 2 in which the step of forming the insulating layer over the edges of the polysilicon layer exposed in each opening is carried out before the introduction into the wafer of the ions of the type characteristic of the one conductivity type for forming the surface zones of the one conductivity type.

5. The process of claim 2 in which the step of forming the insulating layer over the edges of the polysilicon layer exposed in each opening is carried out after the introduction into the wafer of the ions of the type characteristic of the one conductivity-type for forming the surface zones of the one conductivity type.

* * * * *